(12) United States Patent
Kim et al.

(10) Patent No.: US 6,211,089 B1
(45) Date of Patent: Apr. 3, 2001

(54) METHOD FOR FABRICATING GAN SUBSTRATE

(75) Inventors: Chin Kyo Kim; Jae Hyung Yi, both of Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/400,294

(22) Filed: Sep. 21, 1999

(30) Foreign Application Priority Data

Sep. 23, 1998 (KR) .................................................. 98-39499

(51) Int. Cl.[7] .................................................. H01L 21/302
(52) U.S. Cl. .................... 438/691; 438/689; 438/690; 438/692; 438/693; 438/799
(58) Field of Search .................................... 438/689, 690, 438/691, 692, 799, 693

(56) References Cited

U.S. PATENT DOCUMENTS

| 3,643,331 | * | 2/1972 | Futterer et al. . | |
|---|---|---|---|---|
| 3,844,858 | * | 10/1974 | Bean . | |
| 5,268,070 | * | 12/1993 | Nagayama et al. | 156/662 |
| 5,913,712 | * | 6/1999 | Molinar . | |
| 5,993,542 | * | 11/1999 | Yanashima et al. . | |

* cited by examiner

*Primary Examiner*—Long Pham
(74) *Attorney, Agent, or Firm*—Fleshner & Kim, LLP

(57) ABSTRACT

Disclosed is a method for fabricating a smoothly surfaced GaN substrate. A GaN substrate is polished with diamond slurries and then, with boron carbide plates. The irreversible damaged layer which is caused by the mechanical polishing is removed by reactive ion etching, after which the GaN substrate is thermally treated to revive the recoverable damaged layer which is owed to the reactive ion etching. The resulting GaN substrate has a sufficiently smooth surface to allow subsequent thin films of high quality to grow thereon. Based on the GaN substrate of the present invention, blue light elements with excellent properties can be fabricated.

16 Claims, 2 Drawing Sheets

METHOD FOR FABRICATING GAN SUBSTRATE

BACKGROUND OF THE INVENTION

1. Field of the Invention

The present invention relates, in general, to a method for fabricating GaN substrates and, more particularly, to the minimization of defects in GaN substrates, along with the method.

2. Description of the Prior Art

Recently, blue light elements utilizing GaN, such as light emitting diodes (LEDs) and laser diodes (LDs), have been one subject of great interest for many researchers and are now in a mature commercialization phase. As a consequence, such light elements find numerous applications in large size, color flat panel displays, signal lamps, interior lamps, high density light sources, high definition printing systems, optical communication, etc.

The substrates useful in the blue light elements are made of bulk GaN which is obtained by hydride vapor phase epitaxy. This technique is evaluated as being useful in minimizing the defects caused by the thermal expansion difference and lattice mismatch between substrates and thin films deposited thereon.

In order to produce thin films of high quality, these substrates should provide suitable surfaces. However, there remains a need for an improved polishing or pretreatment process that is adapted to accomplish sufficiently flat surfaces.

Using a diamond slurry, plate, or paste, alone, for example, a polishing process is conventionally conducted on bulk GaN substrates. The polished surfaces of the GaN substrates, however, do not show desired surface roughness because there exists a great difference in hardness between the diamond used and the bulk GaN. With expectations to solve this problem, sufficiently small sizes of diamond particles were used to polish GaN substrates, but could not yet bring about sufficiently reduced surface roughness in the GaN substrates.

The resulting surface roughness leads subsequent thin films to three-dimensional growth, making it impossible to obtain thin films of high quality. Upon the mechanical polishing with diamond particles, in addition, there are formed damaged layers whose defects are, in their entirety, transferred to subsequent thin films so that the thin films of high quality cannot be achieved which are as low in defect density as desirable. Consequently, devices of high properties cannot be fabricated by such conventional techniques.

SUMMARY OF THE INVENTION

Therefore, it is an object of the present invention to overcome the above problems encountered in prior arts and to provide a method for fabricating a smoothly surfaced GaN substrate on which thin films of high quality can be deposited.

In one aspect, the present invention provide a method for fabricating a smoothly surfaced GaN substrate, comprising the steps of: providing a raw GaN substrate; polishing the raw GaN substrate with diamond slurries; polishing the GaN substrate with carbide compound plates; etching damaged layers of the polished GaN substrate, the damaged layers being caused by the mechanical polishing; and thermally treating the etched GaN substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

The application of the preferred embodiments of the present invention is best understood with reference to the accompanying drawings.

The bulk GaN as used herein means all of the GaN thin films which are obtained through sublimation methods or bulk crystal growth methods.

In order to polish GaN substrates, diamond slurries, pastes or plates are usually used on account of their high hardness. However, there still exists a large difference in hardness between the GaN substrates and diamond. In fact, diamond particles, although being as small in size as possible, cannot produce surface smoothness to the desired degree.

To avoid this problem, the present invention recruits a polishing process with boron carbide, which is somewhat softer than diamond. The mechanical polishing of a GaN substrate with boron carbide subsequent to diamond slurries results in a smooth surface. This surface, even if smoother than the conventional surfaces which are polished with diamond alone, is insufficient for homoepitaxy because an irreversible damaged layer is also formed. That is, there still remains a problem of deleteriously affecting the growth of subsequent thin films of high quality.

Figure 1:
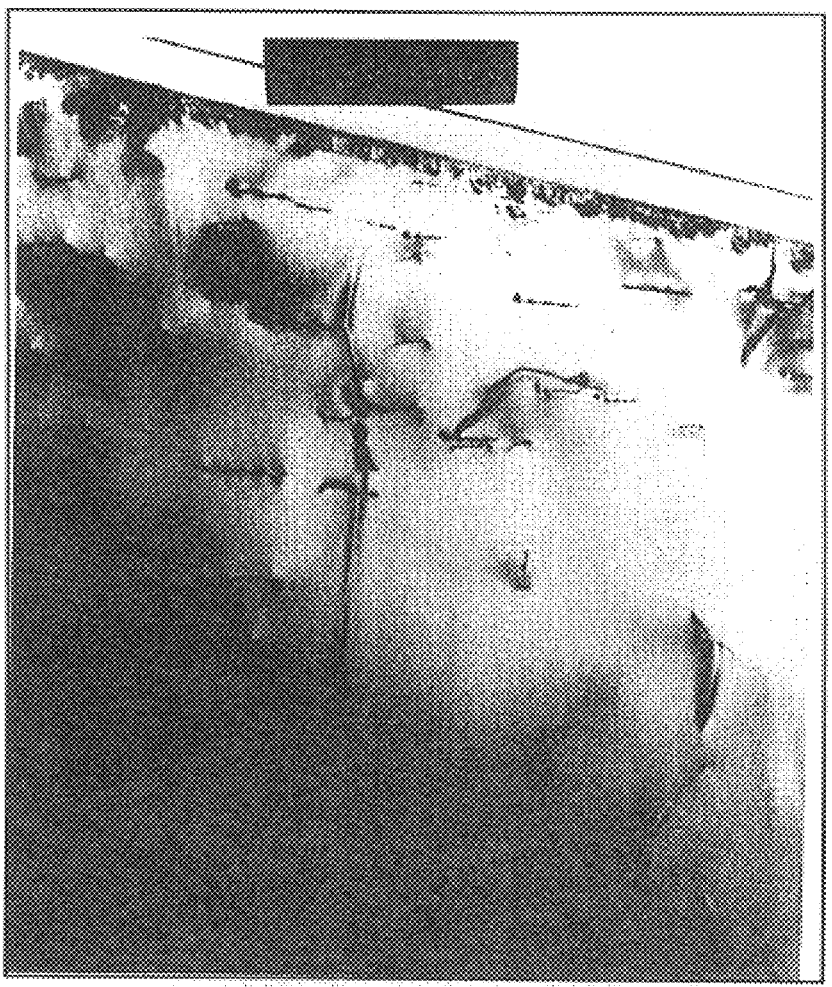
FIG. 1 is a computer generated image of a transmission electronic microscope (TEM) computer screen showing a cross section of a GaN substrate having a damaged layer by mechanical polishing.

Referring to FIG. 1, there is shown a damaged layer attributed to a mechanical polishing process. It is found, as shown in FIG. 1, to be as thick as about 1,000 Å as measured by TEM.

In the present invention, the irreversible damaged layer formed owing to mechanical polishing is removed by use of etching, followed by conducting thermal treatment. Examples of available etching processes include reactive ion etching (RIE), chemically assisted ion beam etching (CAIBE), and wet etching. The subsequent thermal process is adopted for the following reason: when the GaN substrate is etched at an amount thicker than the damaged layer caused by the mechanical polishing, another type of defect is formed due to the high energy of the ions used. Because the resulting damaged layer also has a deleterious influence on the subsequent growth of thin films, it must be cured. In contrast to the damaged layer caused by mechanical polishing, this damaged layer is recoverable. A thermal process is adequate to this end.

Figure 2:
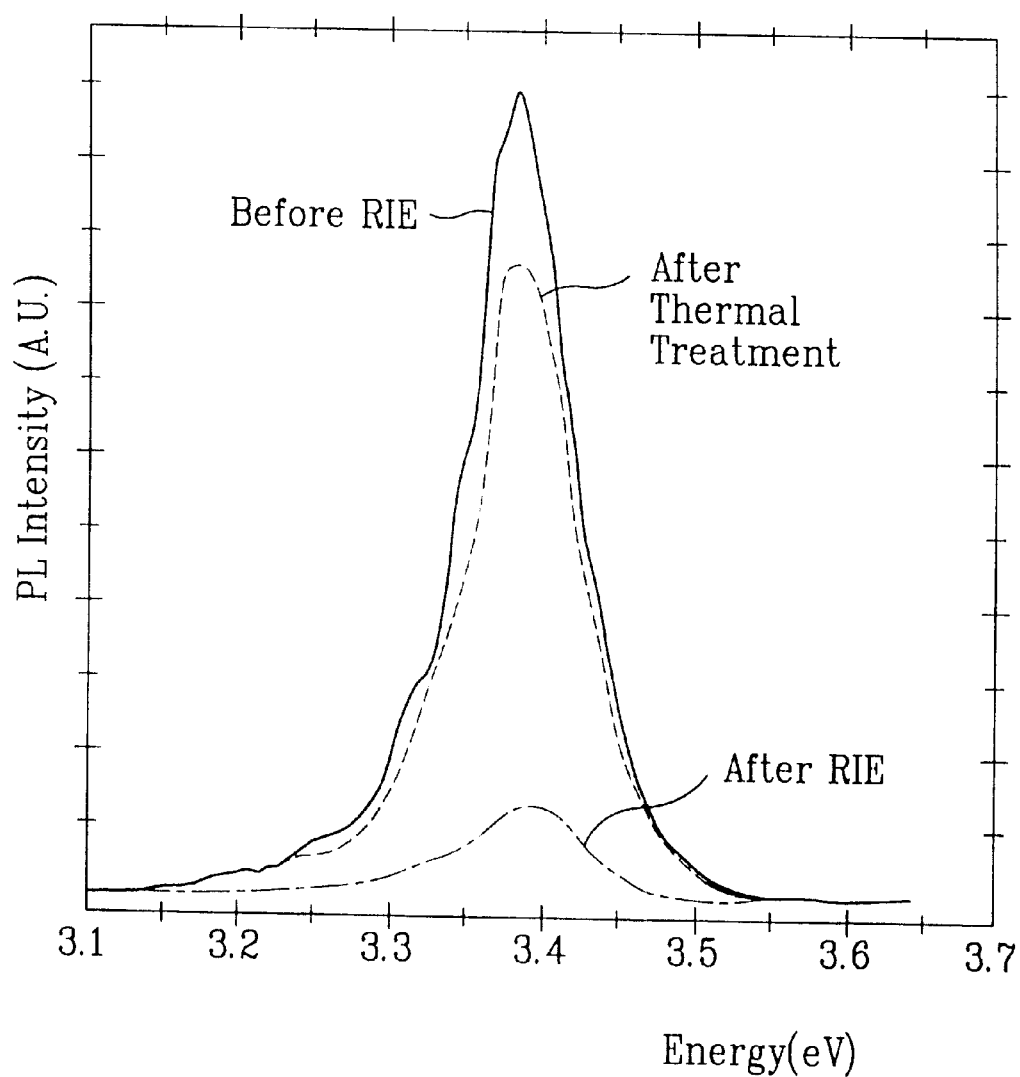
FIG. 2 is a graph showing how the band edge photoluminescence of a bulk GaN substrate is changed as the GaN substrate undergoes reactive ion etching (RIE) and then, thermal treatment.

With reference to FIG. 2, there is shown the recovery of a defective layer to a normal state through thermal treatment. As shown in FIG. 2, the photoluminescence of a light element comprising a GaN substrate is changed from a high state before RIE to a low state after RIE and revived to a similar state to the high state before RIE. After undergoing the thermal treatment, the bulk GaN substrate is a very flat surface which is suitable for homoepitaxy.

A more detailed description will be given of the present invention, below.

First, a bulk GaN substrate is fixed onto a polishing jig with the aid of wax.

Next, the fixed, bulk GaN substrate is polished using diamond slurries with sizes of 15 μm, 9 μm, 3 μm, 1 μm and 0.5 μm, in order. In order for the diamond particles used in one step not to affect the next polishing step, they must be washed by, for example, ultrasonication prior to conducting the next polishing step.

Subsequently, the GaN substrate is polished with a boron carbide plate of 20,000 mesh and then, with a boron carbide plate of 30,000 mesh. The polishing with boron carbide plates is preferably conducted under a pressure of about 1–5 kg/cm$^2$. For example, if the pressure is too high, scratches may form on the substrate. On the other hand, an entirely flat surface cannot be achieved under too low pressure. The bulk GaN substrate obtained according to the present invention is found to be about 2.7 Å in surface roughness as measured by atomic force microscopy (AFM). In contrast, as large as about 10 Å in surface roughness is obtained when polishing with a diamond slurry about 0.25 μm or about 0.1 μm in size.

By means of, for example, a reactive ion etching machine, the bulk GaN substrate is etched deeply enough to completely remove the damaged layer caused by the above mechanical polishing.

After being installed in a rapid thermal processing (RTP) machine, the bulk GaN substrate is thermally treated at a temperature of 300–1,000° C. for a period of 1 sec-1 hour. This thermal treatment is conducted in a nitrogen or ammonia atmosphere in order to prevent nitrogen from being released from the GaN substrate. The GaN substrate which has experienced the reactive ion etching and thermal treatment processes is about 3 Å in surface roughness, almost the same as before the thermal treatment, as measured by AFM.

As described hereinbefore, the present invention provides a bulk GaN substrate which has a sufficiently smooth surface to allow subsequent thin films of high quality to grow thereon, which surface can be obtained by mechanical polishing with diamond and then with boron carbide, etching and thermally treating the substrate. Based on the GaN substrate of the present invention, blue light elements with excellent properties can be fabricated.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating a smoothly surfaced GaN substrate, comprising the steps of:
   providing a raw GaN substrate;
   polishing the raw GaN substrate with diamond slurries;
   polishing the GaN substrate with carbide compound plates;
   etching damaged layers of the polished GaN substrate, said damaged layers being caused by the mechanical polishing; and
   thermally treating the etched GaN substrate.

2. A method as set forth in claim 1, wherein said diamond slurries are used in a decreasing particle size order upon polishing.

3. A method as set forth in claim 2, wherein the larger diamond slurries previously used are completely removed by ultrasonication in order not to affect the next smaller slurries.

4. A method as set forth in claim 1, wherein said etching step is conducted through reactive ion etching, chemically assisted ion beam etching, or wet etching.

5. A method as set forth in claim 4, wherein said reactive ion etching or said chemical assisted ion beam etching is conducted while UV light is illuminated.

6. A method as set forth in claim 1, wherein said thermally treating step is conducted at a temperature of 300–1,000° C. for a period of 1 sec-1 hour in $N_2$ or $NH_3$ atmosphere.

7. A method as set forth in claim 2, wherein said diamond slurries have particle sizes of 15 μm, 9 μm, 3 μm, 1 μm, and 0.5 μm and are sequentially used from the largest to the smallest size.

8. A method as set forth in claim 1, wherein said step of polishing the GaN substrate with carbide compound plates comprises a step of polishing the GaN substrate with a boron carbide plate of 20,000 mesh prior to polishing the GaN substrate with a boron carbide plate of 30,000 mesh.

9. A method for fabricating a smoothly surfaced GaN substrate comprising:
   providing a GaN substrate;
   polishing the GaN substrate, wherein the polishing is performed by sequentially polishing using diamond slurries and carbide compound plates;
   etching damaged layers of the polished GaN substrate caused by polishing; and
   thermally treating the etched GaN substrate.

10. The method of claim 9 wherein GaN substrate is polished multiple times using diamond slurries.

11. The method of claim 10 wherein the diamond slurries have different particle sizes and the diamond slurries are used in a decreasing particle size order upon polishing.

12. A method for fabricating a smoothly surface GaN substrate, comprising:
   providing a GaN substrate;
   polishing the GaN substrate multiple times using diamond slurries with different particle sizes in a decreasing particle size order upon polishing;
   removing slurry between diamond slurry polishing applications by ultrasonication;
   etching damaged layers of the polished GaN substrate caused by polishing; and
   thermally treating the etched substrate.

13. The method of claim 9 wherein the etching is performed using reactive ion etching, chemically assisted ion beam etching, or wet etching.

14. The method of claim 13 wherein the reactive ion etching or the chemical assisted ion beam etching is conducted while UV light is illuminated.

15. The method of claim 9 wherein the thermal treating is performed at a temperature of 300–1000° C.

16. The method of claim 15 wherein the thermal treatment is performed in a $N_2$ or $NH_3$ atmosphere.

* * * * *